United States Patent [19]

Mette et al.

[11] 4,057,713

[45] Nov. 8, 1977

[54] PRESS TRUE-HIT SAFETY COUNTER

[75] Inventors: Klaus Hermann Mette, Burlington; Andrew Raoul St. Denis, Windsor, both of Canada

[73] Assignee: Firan Electronics, Inc., Oakville, Canada

[21] Appl. No.: 703,226

[22] Filed: July 7, 1976

[51] Int. Cl.[2] .......... H03K 21/18

[52] U.S. Cl. .......... 364/476; 235/92 PD

[58] Field of Search .......... 235/151.3, 151.1, 92 PD; 73/140, 136 R, 136 A, 136 B; 340/347 P

[56] References Cited

U.S. PATENT DOCUMENTS

| | | | |
|---|---|---|---|
| B 323,203 | 1/1975 | Komsa | 235/92 PD |
| 3,441,718 | 4/1969 | Hatherell et al. | 235/92 PD |
| 3,839,628 | 10/1974 | Higgins et al. | 235/151.3 |
| 3,916,165 | 10/1975 | Komsa | 235/92 PD |
| 3,934,123 | 1/1976 | Maurer et al. | 235/92 PD |

*Primary Examiner*—Edward J. Wise

[57] ABSTRACT

A counter device is described for counting workpieces produced by stamping or blanking on a power press of the type having a ram powered by a flywheel through a clutch and crankshaft with the flywheel being powered by an electric motor. The counter is arranged to count only workpieces actually produced and operates by detecting cyclic enegy losses of the flywheel during the actual production of a workpiece.

17 Claims, 12 Drawing Figures

PRESS TRUE-HIT SAFETY COUNTER

BACKGROUND OF THE INVENTION

1. Field of the Invention

This invention relates to a monitoring device for power presses, and particularly to a true-hit counter for counter only workpieces actually formed.

2. Description of the Prior Art

A typical power press comprises a frame structure or body which provides a feed path for the stock between relatively moveable tool-carrying members so that tools or dies carried by the latter can act on the stock and be released Therefrom successfully in consequence of the relative movement of the tool-carrying members. One of the tool-carrying members is normally constituted by a slide or ram moveable rectilinearly along a guide path defined by guide means provided for the ram along the frame structure in a direction toward and away from the tool-carrying members constituted by a bed or table on the frame structure. The driving means for the ram comprises a flywheel or other rotary power storage member operatively connected through a clutch with an eccentric element such as a crank, cam or eccentric serving to impart the required movement to the ram. The rotary powered storage member (flywheel) is driven by an electric motor which is the prime energy source for the press.

Many power presses tend to work at a very high speed, producing thousands of workpieces in a day. It is, of course, most important to have some kind of automatic means for providing an accurate count of the actual number of workpieces produced so that the machine can be shut down when a given order has been completed. In view of the manner in which the workpieces are released from the press, it is very difficult to arrange a counting device which will detect and count the work pieces themselves. Because of this difficulty, a system frequently used is to provide a counter which counts each cycle of the ram, it being assumed that one workpiece is produced in each cycle. However, this does not take into consideration the fact that there may be frequent "air hits," i.e. cycles in which there is no metal present between the dies so that noe workpiece is actually produced.

Another problem with power presses is that of an improper or dangerous operation, such as bearing seizure, double hit or over-sized stock. Serious damage to the press is avoided in such situations only by the quick, and sometimes dangerous, action of the press operator. Thus, there is need not only for a system to count workpieces actually produced but to generally monitor and control the operation of a power press.

It is, therefore, the object of the present invention to provide a system which will accurately count only workpieces which are actually formed by a power press and monitor energy lost by forming as well as forces working on the press and die parts.

SUMMARY OF THE INVENTION

Thus, the present invention relates generally to a power press for pressing workpieces from strip metal stock, the press including a ram powered by a rotary storage member, such as a flywheel, through a clutch and eccentric element, such as a crankshaft, with the rotary storage member being powered by a rotary power source, such as an electric motor. According to one feature of the invention, a counting device is provided which is actuated by cyclic energy losses from the flywheel, this counter being adapted to count a workpiece only when the cyclic energy loss exceeds a predetermined amount. The counting device includes means for monitoring the energy of the flywheel for small increments of each revolution thereof and determining any energy loss of the flywheel between small increments of each revolution of the crankshaft. For each revolution of the crankshaft there is a maximum energy loss value recorded for the flywheel and this is compared against a predetermined value. An energy loss value in each revolution of the crankshaft which exceeds the predetermined value then indicates a production hit.

According to another feature of the invention the energy measurements of the flywheel can be utilized together with measurements of the angular position of the crankshaft to monitor at all times the forces that are working on the press. Thus, a force which exceeds a predetermined safety value automatically stops the press.

In accordance with yet another feature of the invention, the measurements of the angular position of the crankshaft are utilized to actuate a press brake set-up and monitoring system.

DESCRIPTION OF THE PREFERRED EMBODIMENTS

The present invention is based on the principle that the exact inertia of the flywheel and additional rotating masses, such as parts of the brake and clutch of a power press can be calculated. Also, the rotating speed of a flywheel can be measured very accurately digitally. Thus, the kinetic energy of a linear travelling mass is $$E = \tfrac{1}{2} mU^2$$

where $E$ is energy, $m$ is mass and $U$ is speed. For a rotating mass this becomes $$E = \frac{1}{2} \int_o^r r^2 \, dm \, U^2$$

where $E$ is energy, $$\int_o^r r^2 \, dm$$

is inertia and $U$ is rpm. Because $U = 1/T$, then $$E = \frac{1}{2T^2} \int_o^r r^2 \, dm,$$

where $T$ is the time to complete 1 rpm.

In the operation of a press, such as a stamping or blanking press, the flywheel serves as a rotary storage member. This flywheel is continuously receiving energy from an electric motor and is continuously losing energy to friction and to the stamping or blanking. Of course, the stamping or blanking action is the prime user of energy and during the very short part of each revolution of the crankshaft during which the die is pressing the metal, a very large amount of energy is used. This energy is taken from that stored in the flywheel. During the remainder of each revolution of the crankshaft, the flywheel recovers its lost energy by input from the electric motor.

According to this invention it has been found that by taking energy measurements of the flywheel for short intervals of each rotation of the crankshaft, e.g. at each degree of crankshaft rotation, and determining the energy loss between measurements, a maximum energy loss will be recorded for each crankshaft revolution. Thus, $$\Delta E = K/(T_D^2 - T_U^2)$$

where $$K = \frac{1}{2} \int_0^r r^2\, dm,$$

$T_D$ is the flywheel speed at downstroke, $T_U$ is the flywheel speed at upstroke and $\Delta E$ is the energy loss.

The maximum energy loss occurs when the downwardly moving ram engages either sheet metal in the press bed or the press bed itself. Thus, by running the press without any sheet metal present, a maximum energy loss reading is obtained for each revolution of the crankshaft and this represents the energy loss for a so-called "air hit" when no workpiece is formed. Then, by providing a counter which will count a "production hit" when a workpiece is formed only when the energy loss for each crankshaft revolution exceeds a predetermined amount and setting this amount at some value greater than the maximum recored for the "air hit," only production hits will be counted by the counter.

The relation between force and energy can be expressed as $$E = FD$$

where $E$ is energy, $F$ is force and $D$ is the distance over which a force is working. In other words, the force that a press must be capable of applying is the amount of energy lost for stamping or blanking over the distance the stamping or blanking takes place. Since the stroke of a press is constant, by measuring the angle position of the crankshaft it is possible to monitor at all times the force that is working on the press.

In operation, the speed of the flywheel as well as the angle position of the crankshaft are continuously measured and this information is continuously fed to a digital computer. The flywheel mass, dimensions etc., are, of course, fixed for each press and this information is retained in the computer memory.

The flywheel speed can be measured by any convenient means. However, it is advantageous for the measurements to be in the form of pulses which are fed to a digital computer. For instance, the flywheel can have a series of circumferentially equally spaced projections or holes which activate a signal generator. A particularly convenient system is to provide a series of equally spaced lobes around the flywheel which pass by a magnetic proximity switch. The passing of each lobe sends one pulse to the digital computer with the time interval between two pulses being measured digitally. Thus, with the distance between lobes being known and the time between lobes being measured, a speed measurement is obtained. This speed measurement combined with the flywheel information in the computer memory allows the computer to calculate the energy. It also calculates the energy loss between energy calculations and determines the maximum energy loss during its crankshaft revolutions, with this being displayed as an energy readout.

The angle position of the crankshaft can be measured by means of an angle transmitter mechanically coupled to the crankshaft. This angle transmitter can conveniently be in the form of a transducer having conductive pattern on a disc, preferably arranged so that pulses are generated in a coded form, a binary coded form being preferred. The code pattern on the disc is preferably GREY code which can be read by solid state sensors, such as photoelectric sensors, which transmit signals to the computer.

These signals give an angular reading of the location of the crankshaft to an accuracy of less than 1°. This information can then be used for a number of different purposes. Firstly, it can be used to give a visual display of the crankshaft angular position. It can also be used, as mentioned above, to monitor at all times the force that is working on the press. The angular information can also be fed to a series of manually adjustable electronic cam switches, e.g. thumb wheel switches, which can then be set to activate or deactivate various systems at precise points during each revolution of the crankshaft. For example, a switch may be set to activate a robot to move or turn a workpiece in the press, or switches may be set to stop and start a feeder at precise locations during a press cycle. Also in a progressive die line where a series of presses are used in progression, adjustable electronic switches responding to a transducer can be used to precisely control the presses in the line.

The monitoring of the forces on the press can be used as a safety device to prevent overloading of the press. For instance, the maximum safe tonnage capacity of the press can be determined and programmed into the computer. Then when the energy loss in the flywheel exceeds the maximum, a warning signal is activated and the press is shut down.

The crankshaft angle position measurement can also serve a further purpose in providing a means for setting up and continuously monitoring the performance of the power press braking system. Thus, the system can be arranged so that an operator can select an angle at which an interrupt signal to the press initiates the brake process to stop the press. An angle readout displays the number of degrees required for the press to come to a stop, while a second readout displays the lapsed time for the press to come to a stop. This gives the operator a visual and absolute indication of the brake adjustment results. For continuous monitoring of the brakes, the system can be arranged so that there is a warning signal if the brakes fail to stop the press within a predetermined number of degrees of rotation.

The system according to this invention can also be used to monitor the energy contribution of the motor. Thus, because of a constant gearing between the motor and flywheel, the motor speed is known from the measurements of the flywheel speed. Also, the characteristics of the motor, such as torque v. speed, are available from the motor manufacturer. The motor characteristics can be programmed into the computer so that it will give a readout of the energy contribution of the motor for any motor speed and thereby indicate the capacity of any press and motor combination.

Certain preferred embodiments of this invention are illustrated by the attached drawings, wherein.

Figure 1:
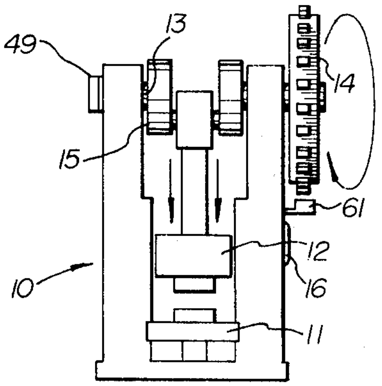
FIG. 1 is a simplified mechanical schematic drawing of a typical power press utilizing the system of the present invention.

As shown in FIG. 1, a typical power press 10 has a press bed 11 which engages a reciprocating ram 12. The ram is driven by means of a crankshaft 13, including an eccentric 15, which is in turn driven from a flywheel 14 through a clutch and brake system. The flywheel is driven by an electric motor 16 through a gearing system.

The system for monitoring the press includes in terms of physical structure a series of lobes 60 fixed to flywheel 14, a magnetic proximity switch 61 which is activated by the lobes and a transducer 49 which is connected directly to the end of the crankshaft 13.

Figure 2:
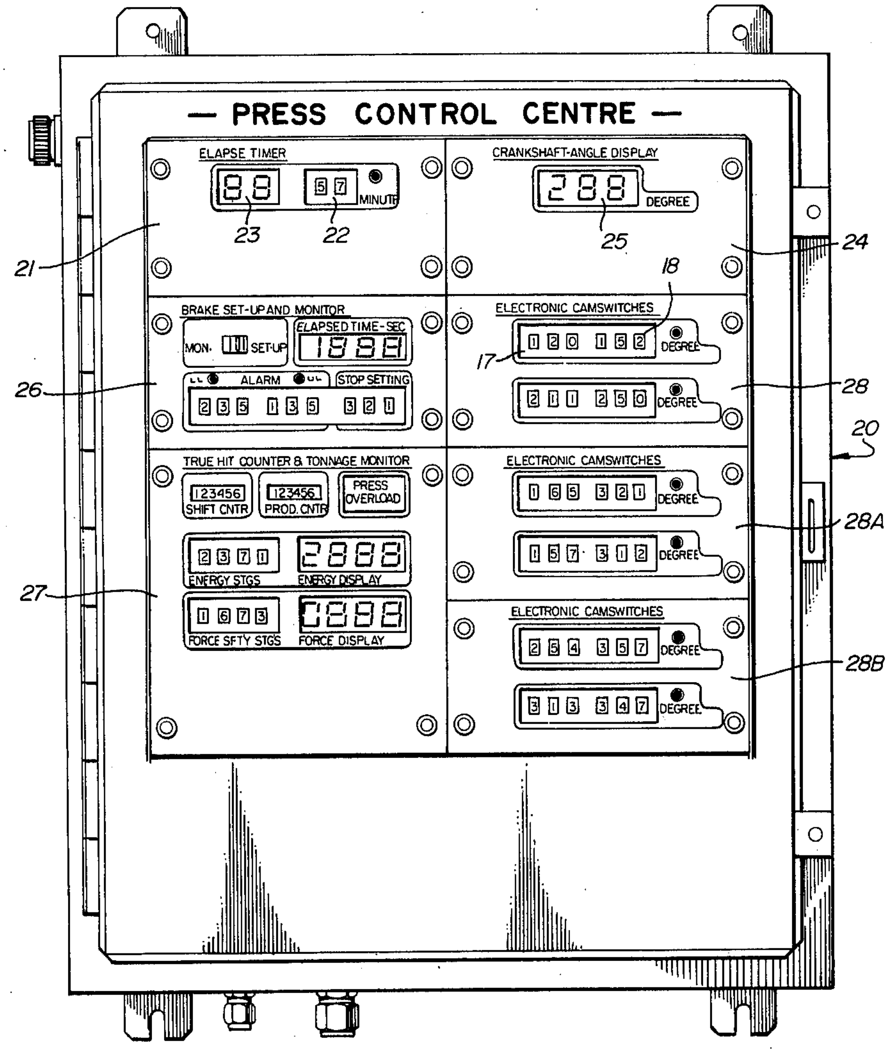
FIG. 2 is an elevational view of a press control panel incorporating the invention.

A typical control panel for the system according to the invention is shown in FIG. 2. This includes a box 20 with a series of plug-in sections or components. The component 21 is a lapse timer which includes a two digit thumb wheel switch 22 and a two digit readout or display 23. This merely records lapsed time after a cycle of the press and returns to zero at the completion of each revolution of the crankshaft. Thus, under normal operation the motor and flywheel are running continuously while the ram operates only cyclicly. The thumb wheel switch 22 can be set so that after the ram has not cycled for a certain number of minutes the power to the drive motor fy the flywheel will automatically be shut off so as to conserve energy.

The panel 24 is a crankshaft angle display which contains a three digit display 25. This displays in degrees the angular position of the flywheel 13 as measured by a transducer.

Figure 3:
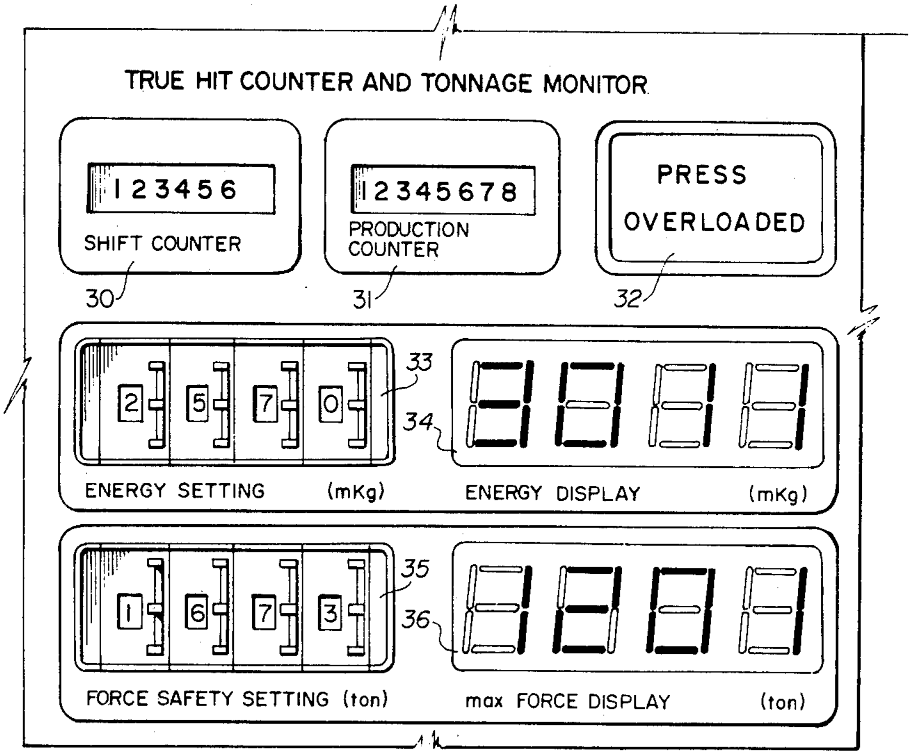
FIG. 3 is a detailed view of the panel section for a true hit counter and tonnage monitor.
Figure 4:
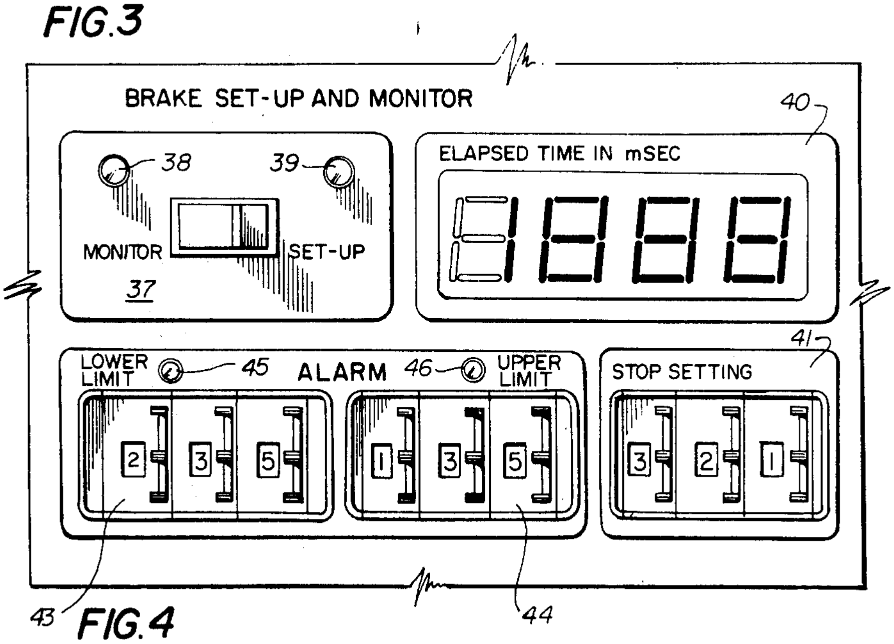
FIG. 4 is a detailed view of the panel section for a brake set-up and monitor.

Component 26 is a brake set-up and monitor system which is shown in greater detail in FIG. 4. The component 27 is a true hit counter and tonnage monitor which is shown in greater detail in FIG. 3.

The components 28, 28*a* and 28*b* represent electronic cam switch units and these are used to control ancillary equipment. Each of these cam switch units contains two such switches with each switch including a left-hand three digit thumb wheel setting and a right-hand three digit thumb wheel setting. These thumb wheel switches are set to the precise locations in each revolution of the crankshaft at which various pieces of ancillary equipment are to be activated or deactivated.

Figure 5:
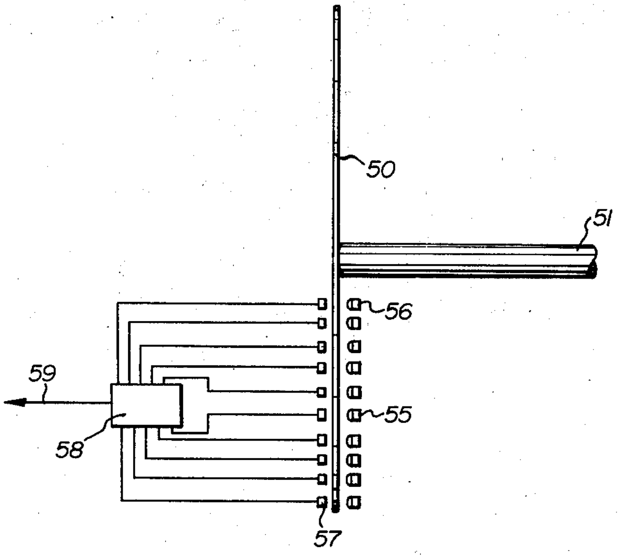
FIG. 5 is an elevational view of an angle measuring transducer.
Figure 6:
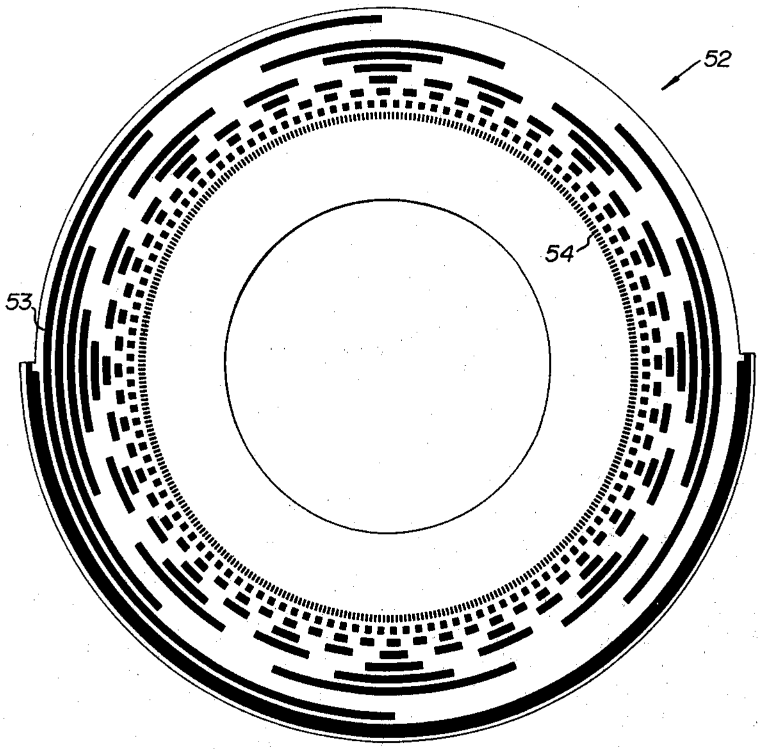
FIG. 6 is an elevational view of a GREY code for measuring angles.

Looking now at the system in greater detail, the transducer 49 which is connected to the end of crankshaft 13 is illustrated in FIGS. 5 and 6. The transducer includes a disc 50 which is connected via connector shaft 51 to the end of crankshaft 13. Thus, the disc 50 is in a direct drive relationship with the crankshaft 13.

The disc 50 includes a GREY code 52 arranged so that pulses are generated in a binary coded form. The disc has a transparent background with a pattern of nine binary channels 53 and one channel 54 generating 360 pulses per revolution. On each side of each channel in the pattern are a light emitting diode 55 and a solid state light sensor 57. These respond to the repeated interruptions by the GREY code to provide and output signal which is alternatively changed from a no-signal state to a signal state, and vice-versa.

Adjacent the simple counting channel 54 are a pair of light emitting diodes 56 and a corresponding pair of sensors which provide a simple counting channel with direction sensing.

The binary code divides the disc into 512 equal segments and the signal outputs of the light sensors are converted by a read only memory 58 into a direct reading of degrees between 0° and 360°, which becomes the output signal 59. This read only memory 58 can conveniently be in a miniaturized form, e.g. a chip and form part of the transducer 49.

Figure 7:
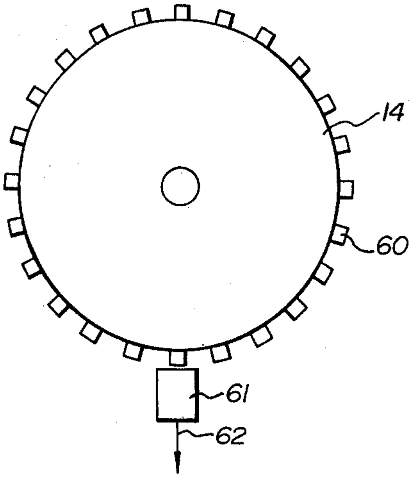
FIG. 7 is an elevational view of the flywheel speed monitoring system.

The direct angle reading obtained above is fed to a microprocessor 70 in the true hit counter and tonnage monitor 27 as well as to the crank shaft angle display 25. The microprocessor used with the present invention is a Motorola MC6800, the characteristics of which may be found in the Motorola publication "Benchmark Family for Microcomputer Systems M6800" May 1975. The other information being fed to the microprocessor 70 is the speed of the flywheel which is obtained according to the arangement shown in FIG. 7. Thus, the flywheel 14 is provided with a series of lobes 60 which pass a magnetic pick-up 61 so as to generate output pulses 62. The time interval between two pulses 62 from the magnetic pick-up 61 is measured digitally by a constant clock pulse generator 71 which is actually within the microprocessor 70 so as to provide an indication of the speed of the flywheel. The memory of the microprocessor contains information on the dimensions, mass, etc. of the flywheel as well as any other moving parts in the press including the clutch, brake, etc., which make up the total momentum of the system. That information combined with the flywheel speed provide all of the necessary data for the microprocessor to carry out a simple calculation as described hereinbefore to provide an energy reading. The microprocessor is also programmed to calculate energy loss between energy readings taken at each degree of revolution of the crankshaft. It is further programmed to detect the maximum energy loss during each revolution of the crankshaft and this maximum energy loss is displayed on the energy display 34.

Figure 9:
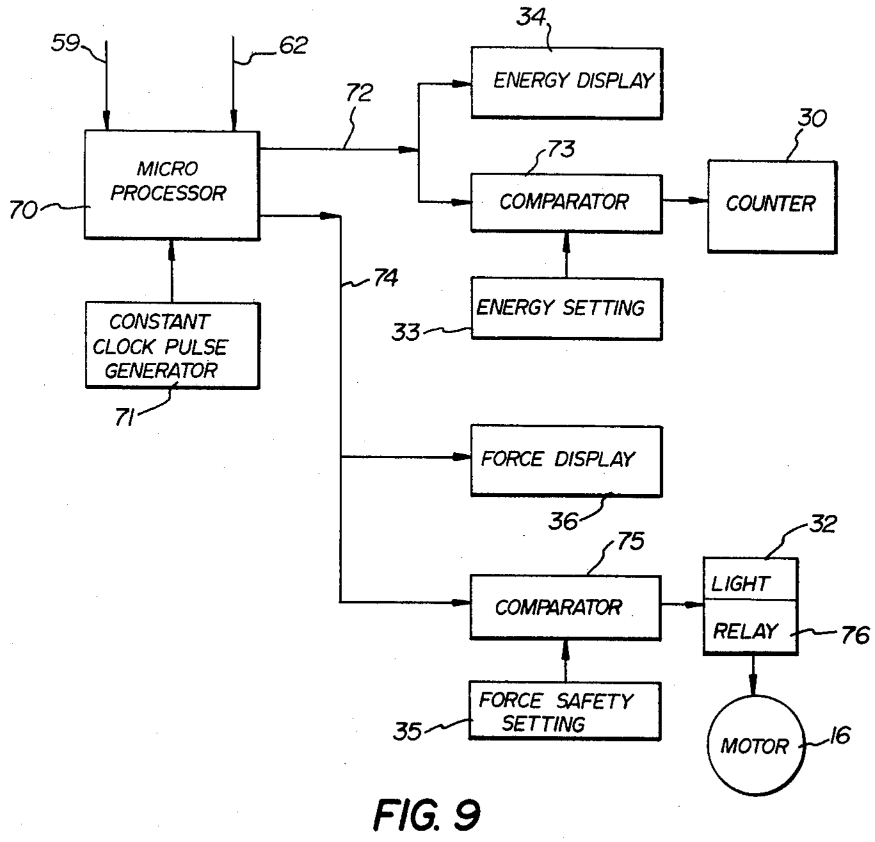
FIG. 9 is a schematic and block diagram of the energy and force monitoring systems.

By running the press without any sheet metal in the press bed, a maximum energy loss reading will be given on display 34 and this represents the energy loss of an air hit where no workpiece is formed. A thumb wheel switch 33 is then set at a value somewhat higher than the value displayed for an air hit but lower than any energy value displayed when sheet metal is present in the press bed. Then, when the press is set into operation, as will be seen from FIG. 9, the energy loss output 72 from microprocessor 70 in terms of a maximum value for each revolution of the crankshaft will display on the energy display 34 and also be fed to a comparator 73 which compares that value with the value set on the energy setting thumb wheel switch 33. If the energy loss value from the microprocessor exceeds the energy setting on the thumb wheel switch 33, then one workpiece is counted by the shift counter 30 and the production counter 31.

The microprocessor also calculates a maximum force for each revolution of the crankshaft and this forms the output signal 74 which is fed to the force display 36 and a comparator 75. Also connected to the comparator 75 is a thumb wheel switch 35 which is set to the maximum safe load for the particular press. This information is available from the press manufacturer. If the maximum force displayed on display 36 exceeds the setting on the thumb wheel switch 35, the press overload light 32 is activated and also a relay 76 which shuts off the power to the press motor 16.

Figure 10:
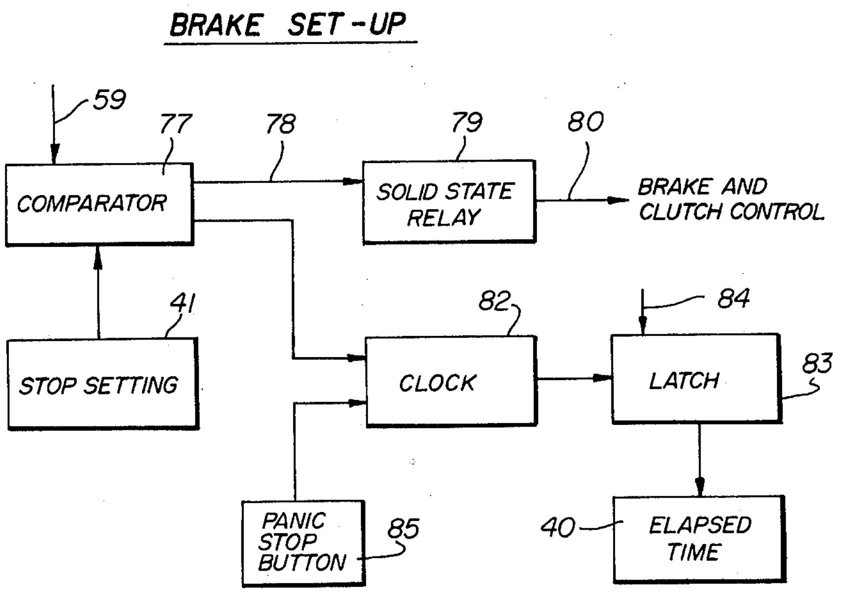
FIG. 10 is a schematic and block diagram of a brake set-up system.
Figure 11:
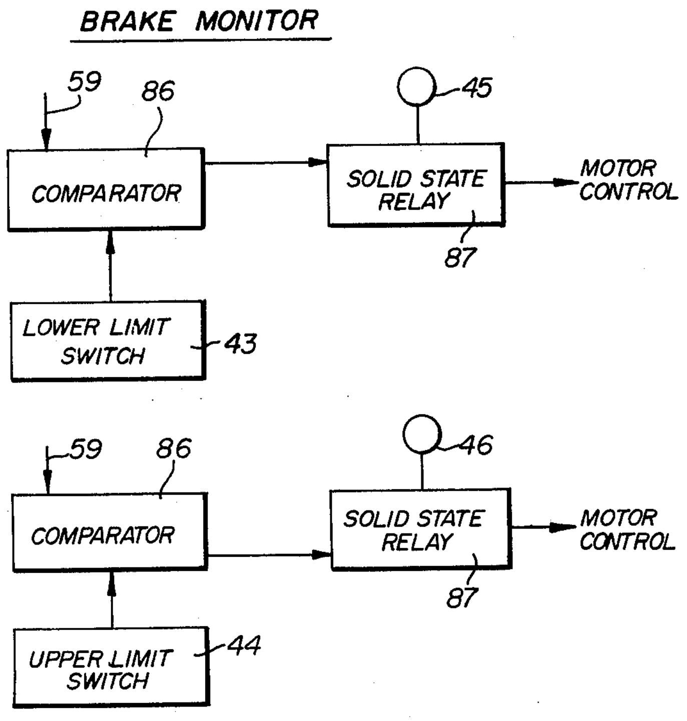
FIG. 11 is a chematic and block diagram of a brake monitoring system.

Details of a press brake set-up and monitoring system are shown in FIGS. 4, 10 and 11. On the control panel 20 the brake set-up and monitor unit includes a thumb switch 37 which can be switched between monitor position and set-up position. Lights 38 and 39 indicate wheather the monitor or set-up system is in operation. A display 40 displays in milli-seconds the elapsed time for the crankshaft to come to a complete stop after the brakes have been activated. It is desirable for the ram to stop in a particular position within each cycle and a thumb wheel switch 41 is provided for setting the angular position of the revolution of the crankshaft at which the brake is to be activated.

Thus, as would be seen from FIG. 10, when a signal is given for the press to stop, a comparator 77 receives angular position pulses 59 from transducer 49 and compares this with the stop setting on the thumb wheel switch 41. When the input signal 59 reaches the stop setting, the comparator 77 transmits a signal 78 to a solid state relay 79 which provides a signal 80 to activate the brake and clutch control. At the same time, a signal 81 is transmitted from comparator 77 to a clock 82 which commences counting lapsed time in milliseconds. This connects through a latch 83 to elapsed time display 40. Thus, when the ram comes to a complete stop, the elapsed time is displayed on the display 40 and the angular position of the crankshaft is displayed on the display 25. This gives an operator a visual and absolute indication of any brake adjustment results during a brake set-up.

Of course, any power press must have a panic stop button for emergencies. This button 85 is connected through clock 82 and latch 83 to the motor control. When the panic stop button is pressed, clock 82 starts from zero to count in milliseconds and the elapsed time is displayed on readout 40. The latch 83 is also receiving signals 84 from the tenth channel 54 of the transducer 49, with a signal being received at each degree of rotation of the crankshaft. When latch 83 stops receiving signals from the transducer, this indicates that the crankshaft has stopped and no more signals are transmitted through the latch from clock 82 to readout 40, leaving a reading on readout 40 of the total lapsed time from the pushing of the panic button to until the crankshaft has come to a full stop.

With switch 37 in the press monitoring position, the system of FIG. 11 comes into operation and this includes a lower limit thumb wheel switch 43 and an upper limit thumb wheel switch 44. These indicate the angular tolerances within which the press can safely come to a stop. These values are set manually and a comparator 86 compares these values with the reading on the angular read out 25 when the press has come to a full stop. Thus, if the press should come to a stop at 230°, the comparator will signal solid state relay 87 to stop the press motor and also activate the lower limit light 45. On the other hand, if the press should stop passed top center at 140°, the comparator will again send a signal to solid state relay 87 to shut off the motor and activate the upper limit light 46. Of course, if the press always comes to a stop within the range of 235° and 135° the alarm and shut-off system is not activated.

Figure 12:
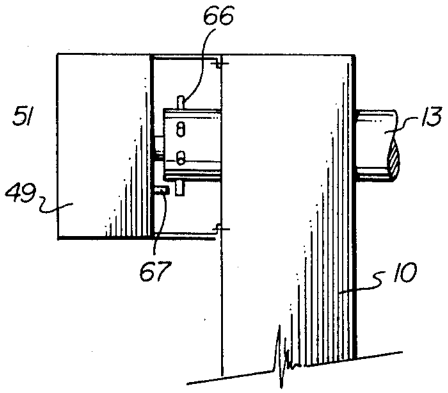
FIG. 12 is an elevational view of a safety monitoring system.

As a further safety feature, the press monitoring system should have a back-up system in the event that there is a failure within the transducer, such as one channel failing to function. As illustrated in FIG. 12, this back-up system can conveniently be in the form of a series of lobes 66 around the circumference of the crankshaft 13 and a magnetic proximity switch 67 connected to transducer 49. Since the lobes 66 are physically connected to the crankshaft, the proximity switch 67 will continue to indicate any motion of the crankshaft when the transducer is malfunctioning. The switch 67 is connected into the system so that if the transducer 59 puts out irregular angular information or no angular information while the switch 67 continues to put out regular motion information, this indicates a malfunction of the transducer and the press is then automatically stopped.

Figure 8:
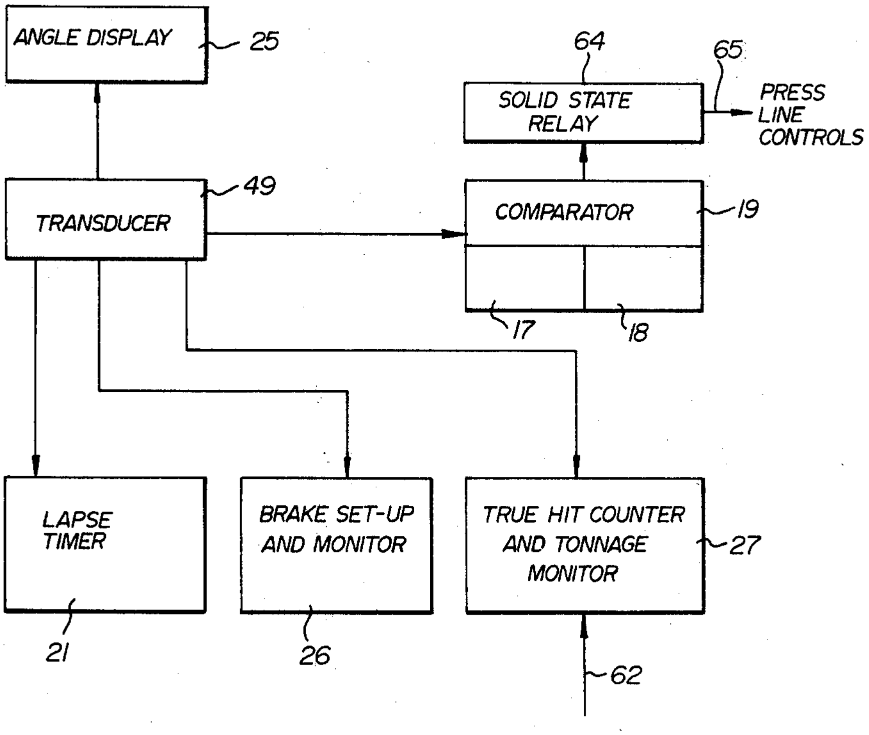
FIG. 8 is a schematic and block diagram of the general system of the invention.

As mentioned hereinbefore, the transducer for determining angular position can also be used for controlling ancillary equipment. It will be seen from FIG. 8 that each component 28 includes a left-hand three digit thumb wheel switch 17 and a right-hand three digit thumb wheel switch 18 calibrated in degrees of revolution of the crankshaft. These are connected to a comparator 19 which is connected to transducer 49. Thus, switch 17 can indicate the angular location where an ancillary piece of equipment is turned on, while switch 18 can indicate the location where it is turned off. The comparator 19 is also connected to a solid state relay 64 so that as the angular information being received from transducer coincides with the thumb wheel settings, the relay 64 is activated to control ancillarly press line equipment via line 65.

It will be appreciated that details of the circuitry of the data processor, read only memory, comparator, etc. have not been shown. Such information is all very well known to those skilled in the art and all of the functions described herein can be carried out using commercially available components.

We claim as our invention:

1. A workpiece counter for a power press having a press bed and a reciprocating ram powered by a flywheel through a clutch and crankshaft with said flywheel being powered by a rotary power source, said workpiece counter comprising (a) means for calculating the energy of the flywheel and associated moving components based on the rotational speed of the flywheel for small increments of each revolution thereof, (b) means for calculating any energy loss of the flywheel between small increments of each revolution of the crankshaft, (c) means for determining the maximum incremental energy loss during each revolution of the crankshaft, (d) means for comparing said maximum incremental energy loss against a predetermined value and (e) a counting device which is activated each time said maximum incremental energy loss exceeds said predetermined amount.

2. The workpiece counter according to claim 1 wherein said energy calculating means comprises means for precisely measuring the time required for the flywheel to rotate through a selected fractional part of one revolution thereof and a data processor programmed to calculate energy of the flywheel therefrom.

3. The workpiece counter according to claim 2 including signal generating means coupled to the crankshaft for generating electrical signals precisely indicative of the angular position of the crankshaft, said signals activating said energy calculating means.

4. The workpiece counter according to claim 3 wherein said signal generating means comprises a light emitting means and a photo-electric receiving means for producing a discrete electrical signal for each rotation of the crankshaft through a selected fractional part of one rotation of the shaft.

5. The workpiece counter according to claim 4 wherein a disc is mounted to rotate with said crankshaft, said disc having a photo-opaque pattern thereon which interrupts said photo-electric means to generate electric signals in binary coded form.

6. The workpiece counter according to claim 5 including a data processor for receiving said electric signals in binary coded form and converting said signals to rotational positions of the crankshaft in degrees.

7. The workpiece counter according to claim 6 including a digital display adapted to indicate the output of said data processor in degrees of a circle.

8. The workpiece counter according to claim 6 including a press brake monitoring system which comprises a first electronic switch adjustable in degrees indicative of the angular position of the crankshaft and being adapted to activate the brake at a predetermined angular location, a further pair of electronic switches adjustable in degrees indicative of the upper and lower limits of angular location within which the crankshaft is required to stop, signal means adapted to be activated when the crankshaft fails to stop between said upper and lower angular limits and a digital display adapted to indicate the lapsed time between the activation of the brake and the crankshaft coming to a complete stop.

9. The workpiece counter according to claim 8 wherein said electronic switch means is a thumb wheel switch.

10. The workpiece counter according to claim 2 wherein said data processor is programmed to (a) convert the rotational speed of the flywheel into units of energy, (b) determine the maximum energy value calculated during each revolution of the crankshaft, (c) compare said maximum energy value against an energy value fed into said data processor by means of an electronic switch adjustable in said units of energy and, (d) provide and output signal to said counting device when said maximum energy value exceeds the value on said electronic switch.

11. The workpiece according to claim 10, including a digital display adapted to indicate the output of said data processor in units of energy.

12. The workpiece counter according to claim 11 wherein said electronic switch means is a thumb wheel switch.

13. The workpiece counter according to claim 10 wherein said data processor is also programmed to determine from the maximum energy value a maximum force value applied by the ram during each revolution of the crankshaft, to compare said maximum force value against a force value fed into said data processor by means of an electronic switch adjustable in said units of force and to provide an output signal which stops the power press when said maximum force value exceeds the value on said electronic switch.

14. The workpiece counter according to claim 13 wherein said electronic switch is a thumb wheel switch.

15. The workpiece counter according to claim 2 including a series of physical signal interrupting means on said flywheel at equally spaced circumferential locations, signal generating means adapted to transmit a signal at the passage of each interrupting means and time measuring means for measuring the lapsed time between signals.

16. The workpiece counter according to claim 15 wherein the signal interrupting means are projecting lobes on the circumference of the flywheel and the signal generating means is a magnetic proximity switch.

17. The workpiece counter according to claim 16 wherein the time measuring means is a crystal clock.

* * * * *